United States Patent [19]
Choi et al.

[11] Patent Number: 5,768,191
[45] Date of Patent: Jun. 16, 1998

[54] METHODS OF PROGRAMMING MULTI-STATE INTEGRATED CIRCUIT MEMORY DEVICES

[75] Inventors: Young-Joon Choi; Kang-Doeg Suh, both of Kyungki-do, Rep. of Korea

[73] Assignee: Samsung Electronics Co., Ltd., Suwon, Rep. of Korea

[21] Appl. No.: 761,302

[22] Filed: Dec. 6, 1996

[30] Foreign Application Priority Data

Dec. 7, 1995 [KR] Rep. of Korea ............... 95-47555

[51] Int. Cl.$^6$ .................................................. G11C 16/06
[52] U.S. Cl. ..................... 365/185.22; 365/185.03; 365/185.12; 365/185.2
[58] Field of Search ................... 365/185.22, 185.03, 365/185.12, 185.2, 189.05

[56] References Cited

U.S. PATENT DOCUMENTS

| | | | |
|---|---|---|---|
| 5,163,021 | 11/1992 | Mehrotra et al. | 365/185.03 |
| 5,394,362 | 2/1995 | Banks | 365/189.01 |
| 5,450,341 | 9/1995 | Sawada et al. | 365/185.24 |
| 5,523,972 | 6/1996 | Rashid et al. | 365/185.22 |
| 5,539,690 | 7/1996 | Talreja et al. | 365/185.22 |
| 5,541,886 | 7/1996 | Hasbun | 365/230.01 |
| 5,546,042 | 8/1996 | Tedrow et al. | 327/538 |
| 5,566,111 | 10/1996 | Choi | 365/185.22 |
| 5,566,125 | 10/1996 | Fazio et al. | 365/45 |
| 5,583,812 | 12/1996 | Harari | 365/185.33 |

Primary Examiner—David C. Nelms
Assistant Examiner—Andrew Q. Tran
Attorney, Agent, or Firm—Myers, Bigel, Sibley & Sajovec, P.A.

[57] ABSTRACT

Methods of programming multi-state memory devices include the steps of programming a nonvolatile multi-state memory cell (e.g., EEPROM) from a reference state (e.g., erased state) towards a first program state, by applying a first program voltage ($V_{pgm}$) thereto. The first program voltage is preferably applied for a first predetermined time interval so that sufficient Fowler-Nordheim tunneling of electrons can occur into the cell's floating gate to cause a shift in the cell's threshold voltage from the reference state (e.g., Vth=−2 V) to a first program state (e.g., −1 V≦Vth≦−0.5). To verify the step of programming the memory cell into the first program state, a operation is performed by a sense amplifier to sense a first state of the memory cell, upon application of a first reference voltage thereto. Once verification of the first program state has been achieved, another programming step may be performed to program the memory cell from the first program state to a second program state, by applying a second program voltage thereto and then sensing a second state of the memory cell upon application of a second reference voltage thereto (e.g., $V_{pref2}$>$V_{pref1}$). For example, the second program voltage ($V_{pgm}$) is preferably applied for a second predetermined time interval so that sufficient additional Fowler-Nordheim tunneling of electrons can occur into the cell's floating gate to cause a shift in the cell's threshold voltage from the first program state (e.g., Vth=−1 V) to the second program state (e.g., 0 V≦Vth≦0.5 V).

17 Claims, 7 Drawing Sheets

|  | STATE PROGRAM | | | STATE PROGRAM -VERIFY | | | STATE READ | | |
|---|---|---|---|---|---|---|---|---|---|
|  | 1ST | 2ND | 3RD | 1ST | 2ND | 3RD | 1ST | 2ND | 3RD |
| PGM1 | Vcc | 0V | Vcc | 0V | 0V | 0V | 0V | 0V | 0V |
| PGM2 | 0V | Vcc | 0V | 0V | 0V | 0V | 0V | 0V | 0V |
| VFY1 | 0V | 0V | 0V | CLOCK | 0V | CLOCK | 0V | 0V | 0V |
| VFY2 | 0V | 0V | 0V | 0V | CLOCK | 0V | 0V | CLOCK | 0V |
| READ1 | 0V | 0V | 0V | 0V | 0V | 0V | CLOCK | 0V | CLOCK |
| Vcg | Vpgm | Vpgm | Vpgm | Vpref1 | Vpref2 | Vpref3 | Vref1 | Vref2 | Vref3 |

METHODS OF PROGRAMMING MULTI-STATE INTEGRATED CIRCUIT MEMORY DEVICES

FIELD OF THE INVENTION

The present invention relates to integrated circuit semiconductor devices, and more particularly to integrated circuit memory devices and methods of operating integrated circuit memory devices.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type (e.g., p-type), spaced source and drain regions of second conductivity type (e.g., N-type) in the substrate, a channel region at a face of the substrate, between the spaced source and drain regions, a floating gate for storing charge carriers when the device is programmed and a control gate which overlies the floating gate, opposite the channel region. Operation of a flash EEPROM device is typically divided into three modes including programming, erasing and reading.

Programming of a flash EEPROM device is typically achieved by biasing the drain region to a first positive bias, relative to the source region, and biasing the control gate to a second positive bias which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer which separates the floating gate from the channel region. This electric field attracts the hot electrons and accelerates them toward the floating gate, which is disposed between the control gate and the channel region, by a process known as tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate will cause the effective threshold voltage ($V_{th}$) of the field effect transistor comprising the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$).

In this state, known as the programmed state, the EEPROM device may be said to be storing a logic 0. Once programmed, the EEPROM device retains its higher threshold voltage even when its power supply is interrupted or turned off for long periods of time.

Reading of the EEPROM device is achieved by applying a predetermined read voltage ($V_{read}$) to the control gate, typically via a word line connecting a row of identical EEPROM devices or "cells", and applying a positive bias to the drain region, typically via a bit line connecting a column of identical EEPROM cells. If the EEPROM device is programmed, it will not conduct drain current ($I_{ds}$). However, if the EEPROM device has not been programmed (or has been erased), it will heavily conduct. In this state, the EEPROM device may be said to be storing a logic 1. Thus, by monitoring the bit line current, the programmed state (i.e., 1 or 0) of the EEPROM device can be determined.

Erasing of the EEPROM device may also be achieved by removing the stored charge from the floating gate. The erasure process can be achieved, for example, by grounding the control gate and applying a positive bias to the substrate (e.g., 10–20 Volts). Accordingly, flash EEPROM devices typically require bulk erasure of large portions of an array of cells since the effects of applying a large substrate bias typically cannot be confined to a single EEPROM cell.

As will be understood by those skilled in the art, a flash EEPROM integrated circuit memory device may contain a column-by-column array of NAND EEPROM cells having the general construction illustrated in cross-section and schematically by FIGS. 11.58 and 11.59 from a handbook by B. prince et al. entitled *Semiconductor Memories*, John Wiley & Sons Ltd., pp. 603–604 (1991); and in an article by M. Momodomi et al. entitled *An Experimental 4-Mbit CMOS EEPROM with an NAND Structured Cell*, IEEE Journal of Solid State Circuits, Vol. 24, No. 5, p. 1238 October, (1989).

Although the above-described memory cells have been described as two-state devices having only one erased and one programmed state, accurate control of the threshold voltages of an EEPROM cell can be utilized to provide a multi-state memory device having more than two states. For example, rather than just an erased state where $Vth \leq -3$ V and a programmed state where $Vth \geq 1$ V, an EEPROM memory cell may be carefully programmed to have four (4) states, for example, where $Vth \leq -2$ V for state "11", $Vth=-1$ for state "10", $Vth=OV$ for state "01" and $Vth=1$ V for state "00". Thus, an EEPROM memory cell can be programmed to be a two-bit device instead of just a one-bit device which advantageously doubles the amount of information an EEPROM memory cell may contain.

To further illustrate the possibility of using an EEPROM memory cell as a four (4) state device (i.e., one reference state and three program states), FIG. 1 describes a conventional program and verify circuit which can be utilized with a multi-state memory device. In particular, the state of a memory cell 214 can be measured by applying a predetermined control gate voltage $V_{cg}$ thereto and using a current mirror with three possible reference currents to verify the state of the memory cell 214 at one of the three program states. The current mirror contains PMOS transistors 201 and 202 which are connected to VCC. The drain of PMOS transistor 201 is connected by line 212 to a reference current generator 300, as illustrated. The first, second and third reference cells 221–223 each draw a predetermined respective different current. Thus, by applying the clock signals CLK1–CLK3 in an appropriate sequence to NMOS transistors 218–220, three different reference current levels can be established in line 212. Moreover, by appropriately choosing these three levels against expected current levels to be established in the memory cell 214 when programmed at one of three different program states, the program state of the memory cell can be established based on the potential of the drain of NMOS transistor 202 (which is connected to NMOS transistor 213). In particular, the drain of NMOS transistor 202 can be switched to a logic 1 potential when the current through the memory cell is less than the particular reference current level.

The programmed state of the memory cell at different program levels can then be loaded into latches formed by inverters 206–211. Accordingly, outputs SAO1–SAO3 can be monitored to determine whether a memory cell has been programmed to a desired state. When this occurs, SAO1–SAO3 will all be set at logic 0 levels to trigger the program inhibit circuit when the output of NOR gate 216 switches to a logic 1 level. A bit decoder 217 and bit encoder 224 are also provided to control the reference current generator 300, based on the states of SAO1–SAO3. Unfortunately, in the event a plurality of memory cells in a page are to be programmed at the same time, a plurality of reference current generators 300 will also be required for each cell in the page. But, this requirement can limit the amount of space available for additional memory devices and therefore offset the advantages to be obtained by using a higher capacity multi-state memory cell.

Thus, notwithstanding the above described technique for improving the capacity of an integrated circuit memory device by employing multi-state memory devices therein, there continues to be a need for improved memory devices which can advantageously use multi-state devices therein.

SUMMARY OF THE INVENTION

It is therefore an object of the present invention to provide improved methods of operating integrated circuit memory devices and devices formed thereby.

It is another object of the present invention to provide highly integrated memory devices having high operating speeds and methods of operating same.

It is still another object of the present invention to provide methods of operating integrated circuit memory devices having multi-state cells therein which can be selectively programmed.

These and other objects, features and advantages of the present invention are provided by methods of operating integrated circuit memory devices having multi-state memory cells therein. These methods include the steps of performing multiple programming and verification operations in an alternating sequence to improve the efficiency of programming the multi-state memory cells, using simpler programming circuits. According to one embodiment of the present invention, a method is provided which comprises the steps of programming a nonvolatile multistate memory cell (e.g., EEPROM) from a reference state (e.g., erased state) towards a first program state, by applying a first program voltage ($V_{pgm}$) thereto. For example, in the event the memory cell comprises an EEPROM memory cell, the first program voltage is preferably applied for a first predetermined time interval so that sufficient Fowler-Nordheim tunneling of electrons can occur into the cell's floating gate to cause a shift in the cell's threshold voltage from the reference state (e.g., Vth=−2 V) to a first program state (e.g., −1 V≤Vth≤−0.5). To verify the step of programming the memory cell into the first program state, a operation is performed by a sense amplifier to sense a first state of the memory cell, upon application of a first reference voltage thereto. For example, by applying an appropriate first reference voltage ($V_{pref1}$) having a magnitude at about a lower limit of the threshold voltage(s) associated with the first program state, the success of the first state programming operation can be verified by sensing whether the memory cell is conductive ("on"), which means that insufficient programming has occurred, or nonconductive ("off") which means that sufficient programming has occurred. If verification is not achieved initially, the first state programming operation can be performed again and then reverified.

Once verification of the first program state has been achieved, another programming step may be performed to program the memory cell from the first program state to a second program state, by applying a second program voltage thereto and then sensing a second state of the memory cell upon application of a second reference voltage thereto (e.g., $V_{pref2} > V_{pref1}$). For example, the second program voltage ($V_{pgm}$) is preferably applied for a second predetermined time interval so that sufficient additional Fowler-Nordheim tunneling of electrons can occur into the cell's floating gate to cause a shift in the cell's threshold voltage from the first program state (e.g., Vth=−1 V) to the second program state (e.g., 0 V≤Vth≤0.5 V). If the memory cell is to be programmed into a third (or higher) program state (e.g., 1 V≤Vth≤1.5 V), the above described programming and verification operations can be performed again and again until the desired program state is established and verified. If verification cannot be achieved, a flag indicating a program failure may be set.

The above described operations are also preferably controlled by a program inhibition circuit which monitors the state of a memory cell to be programmed and terminates subsequent programming operations once the desired program state has been achieved and successfully verified. In particular, in the case of an EEPROM cell having four (4) states (i.e., a reference state and three program states), two bits of data (00, 01, 10, and 11) can be loaded from a bit line into a respective two-bit latch to specify the desired program state to be achieved using the above described operations. Here, for example, the "11" data can represent the reference state, the "10" data can represent the first program state, the "01" data can represent the second program state and the "00" data can represent the final third program state. These four possible combinations can then be monitored by the program inhibition circuit 106 to determine how many repeated programming and verification operations need to be performed to place the designated memory cell in the proper program state. Thus, in the event the loaded data is "11", no programming operations are performed and the memory cell is left in an unprogrammed (e.g., erased) state. But if the loaded data is "10", "01" or "00", then one, two or three program and verification operations will need to be performed in sequence, respectively.

According to a preferred aspect of the present invention, the program voltages and the reference voltages are preferably applied at appropriate time intervals to a plurality (e.g., page) of EEPROM memory cells using a common word line and the data to be loaded into each memory cell in the page is preferably initially loaded into respective two-bit latches from respective bit lines. For a four state cell, the above described programming and verification operations are performed a maximum of three times. However, the loaded data for each memory cell is preferably updated to keep track of whether an additional program and verify operation is required to place the cell in the desired state. If not, the loaded data is switched to a program inhibition state (e.g., "11") so that the subsequent application of program and reference voltages to the word line do not further influence the program state of the particular memory cell.

For example, if the loaded data is "10", one complete program and verify operation will be performed and then the loaded data will be switched to "11" to initiate the program inhibition circuit which precludes further programming. If the loaded data is "01", two complete program and verify operations will be performed and then the loaded data will be switched to "11" to initiate the program inhibition circuit. Finally, if the loaded data is "00", three complete program and verify operations will be performed and then the loaded data will be switched to "11".

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 2:
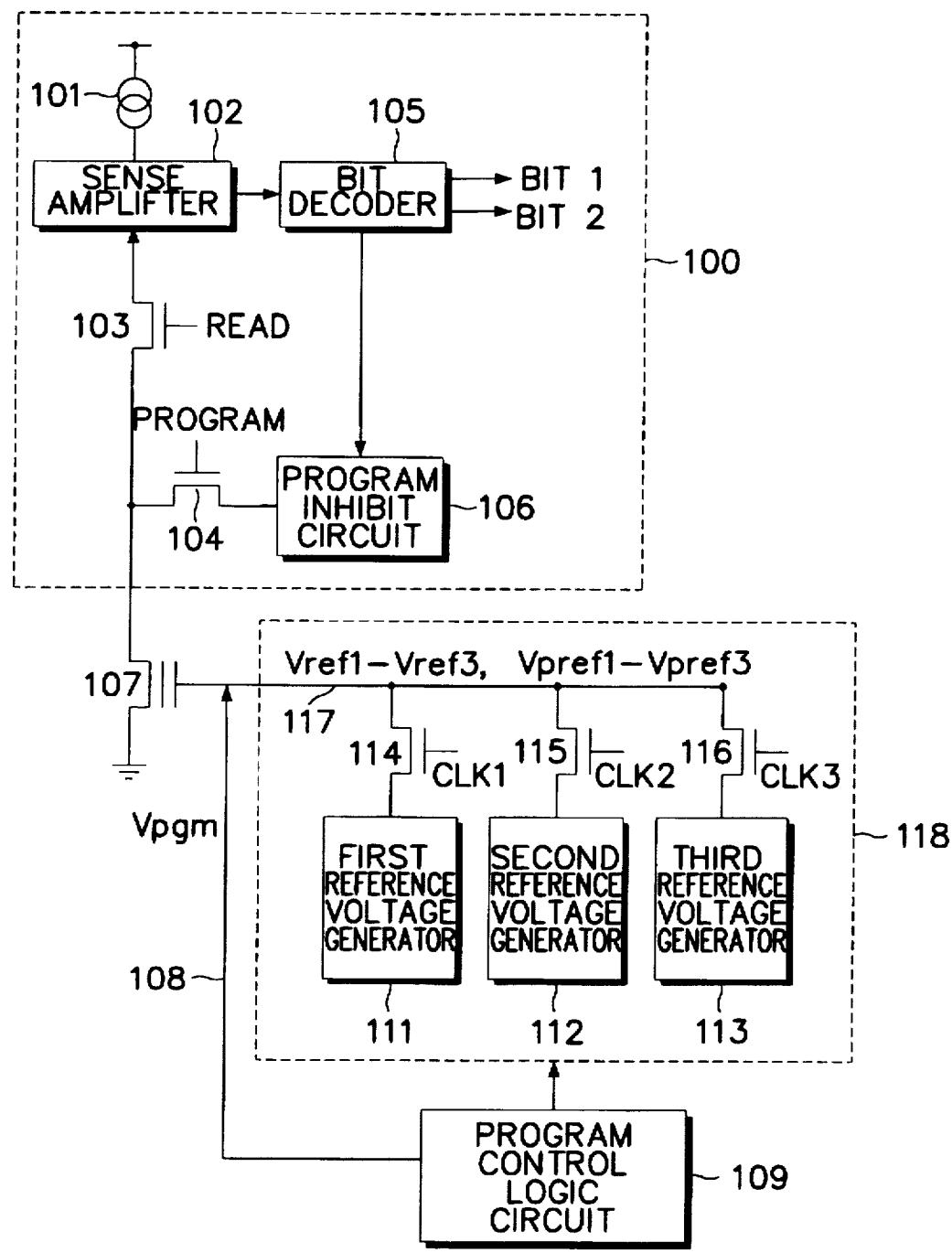
FIG. 2 is an electrical circuit schematic of a circuit for performing program and verify operations in a multi-state nonvolatile integrated circuit memory device according to an embodiment of the present invention.

Referring now to FIG. 2, a circuit schematic for performing program, verify and read operations according to an embodiment of the present invention will now be described. In particular, the circuit of FIG. 2 includes a control circuit 100, a multi-state reference driver 118 and a program control logic circuit 109 for programming, verifying and reading a state of a memory cell 107 shown as an EEPROM memory cell. In the control circuit, a sense amplifier 102 and current source 101 of conventional design are provided. As illustrated, the sense amplifier 102 is coupled to an output (e.g., drain) of the memory cell 107 by an NMOS transistor 103 which is responsive to a READ signal. As will be understood by those skilled in the art, the sense amplifier 102 may determine the program state of the memory cell 107 (i.e., "on" or "off") when a specific control gate voltage "$V_{ref}$" is applied to the memory cell 107. Here, the memory cell 107 will be in the "on" or conductive state whenever $V_{ref}$ is greater than the cell's threshold voltage $V_{th}$, (i.e., program state) and "off" whenever $V_{ref}$ is less than the cell's threshold voltage. In the event the memory cell 107 is conductive, the input to the sense amplifier 102 will be pulled to ground potential, however if the memory cell is off or nonconductive, the input to the sense amplifier 102 may be pulled up to a logic 1 potential.

Figure 1:
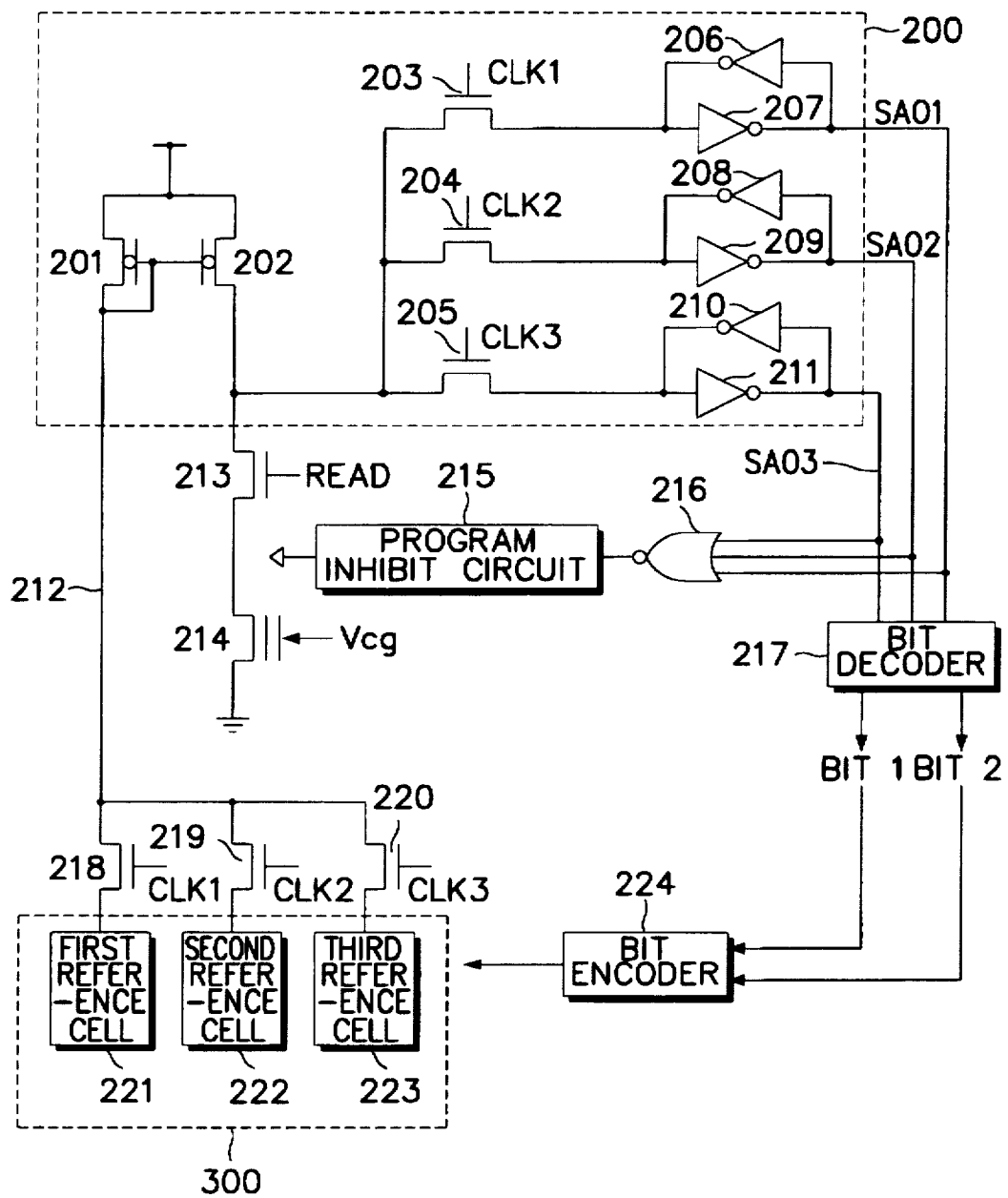
FIG. 1 is an electrical circuit schematic of a circuit for performing program and verify operations in a conventional multi-state nonvolatile integrated circuit memory device.

As illustrated, an output of the sense amplifier is fed to a two-bit decoder 105 which, as explained more fully hereinbelow, contains a two-bit latch. The two-bit latch is initially loaded from a bit line with the desired state (i.e., 00, 01, 10 or 11) to be programmed into the memory cell 107. Once the memory cell 107 has been fully programmed, a program inhibit circuit 106 may be activated to stop further programming of the memory cell 107. As illustrated by FIG. 2, the program inhibit circuit 106 may be coupled to the output of the memory cell 107 by another NMOS transistor 104 which is responsive to a PROGRAM signal. The multi-state reference driver 118 is illustrated as containing three reference voltage generators 111–113, which are responsive to outputs of the program control logic circuit 109. In particular, the program control logic circuit 109 controls the generation of a program voltage ($V_{pgm}$) of sufficient magnitude on line 108 to cause Fowler-Nordheim tunneling of electrons from the channel to the floating gate of the memory cell 107 and the generation of six reference voltages to be used during verification of the programming operations, as more fully described hereinbelow. The program control logic circuit 109 is also responsive to the values of BITS 1 and 2 generated by the bit decoder 105. For example, in response to appropriate clocking signals CLK1–CLK3 applied to NMOS transistors 114–116, the driver 118 generates $V_{ref1}$, $V_{pref1}$, $V_{ref2}$, $V_{pref2}$, $V_{ref3}$, $V_{pref3}$ from the voltage generators 111–113, on line 117. As described more fully hereinbelow, the lines 108 and 117 may be combined as a word line W/L which drives a plurality of memory cells connected as a page in an array thereof. Thus, in contrast to the prior art of FIG. 1, current reference cells 221–223 are not required for each cell in an array thereof.

Figure 3:
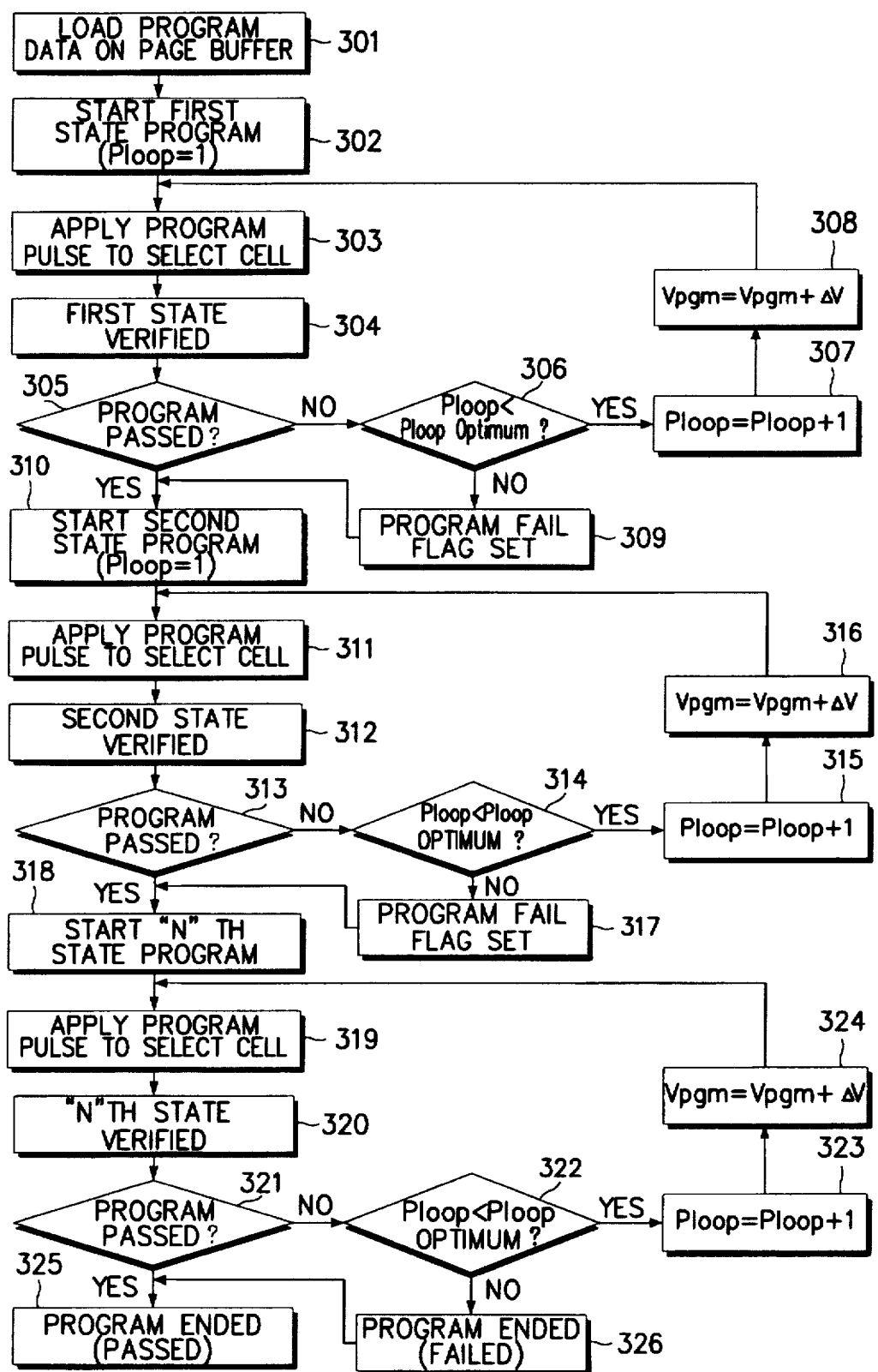
FIG. 3 is a flow chart of steps illustrating a method of performing program and verify operations according to an embodiment of the present invention.

Referring now to FIG. 3, a preferred method of performing program and verify operations according to an embodiment of the present invention, will now be described. The operations begin with the step of loading program data into a page buffer, Block 301. As will be understood by those skilled in the art, page buffers of integrated circuit memory devices are typically provided to buffer output data from a page of selected memory cells during a read operation and buffer input data to be programmed into a page of memory cells during a program operation. Here, the page buffer may be coupled to bit lines for each of the multi-state cells (or a string of cells such as a NAND string) so that the desired program state of a cell to be programmed can be loaded from the buffer to the bit lines and then into the bit decoder 105 or the latches formed by inverters 404–405 and 411–412 of FIG. 4, as explained more fully hereinbelow. Referring now to Block 302, the operations for programming a memory cell (e.g., EEPROM cell 419 in FIG. 4) to the desired program state commence by initializing a program counter (ploop=1) and then applying a first program voltage ($V_{pgm}$) as the control gate voltage ($V_{cg}$) to program the memory cell from a reference state ("11") towards a first program state ("10"), Block 303. Here, the program voltage is applied as a pulse of predetermined duration so that sufficient Fowler-Nordheim tunneling of electrons can occur into the memory cell's floating gate to cause a shift in the cell's threshold voltage from the reference state (e.g., Vth=−2 V) to a first program state (e.g., −1 V<Vth≦−0.5 V).

A step is then performed to verify whether sufficient programming has occurred to program the cell into the first program state, Block 304. This verification step may be performed by applying a first reference voltage ($V_{pref1}$) to the control gate of the memory cell and then sensing the state of the memory cell with a sense amplifier. In particular, if the memory cell is conductive when $V_{pref1}$ is applied, then the threshold voltage of the memory cell has not been sufficiently increased from the reference state and sufficient programming has not occurred, Block 305. A check is then performed to determined whether the number of times the memory cell has been programmed to achieve the first state is less than an optimum number, Block 306. If so, the program counter is incremented, Block 307, and then another program voltage is applied to the memory cell to cause further programming, Block 303. As will be understood by those skilled in the art, an increase in the duration of the application of the program voltage ($V_{pgm}$) and/or an increase in the magnitude of the program voltage both contribute to further programming. Thus, the magnitude of the program voltage may be increased, Block 308, or the duration may be increased, or both the duration and magnitude may be increased. However, as illustrated by Blocks 306, 309, if the number of attempts to program the memory cell into the first program state is excessive, a flag is set to indicate the occurrence of a program failure.

Figure 4:
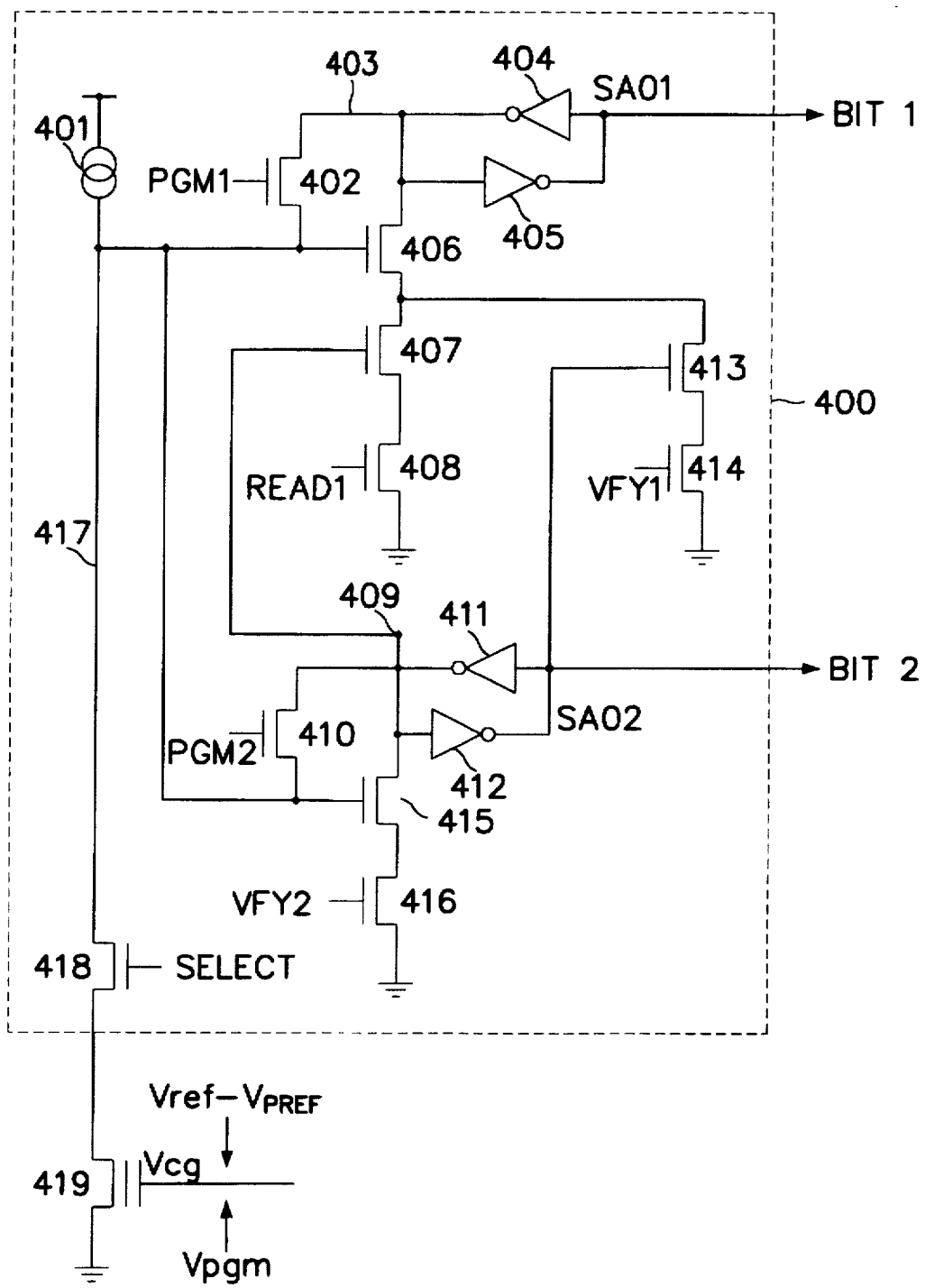
FIG. 4 is a detailed electrical circuit schematic of a portion of the circuit of FIG. 2.

Once the first program state has been verified, a step is performed to further program the memory cell into a second program state ("01"), Block 310. As explained more fully hereinbelow, if the desired program state is the first program state, then the programming and verification operations are terminated by the program inhibition circuit (when BITS 1 and 2 of FIGS. 2 and 4 are set to "11"). However, if further programming is desired, the operations performed by Blocks 310–317 proceed as described above with respect to Blocks 302–309. During these operations, a second reference voltage ($V_{pref2}>V_{pref1}$) is applied to the control gate of the memory cell to determine whether the second program state has been achieved. This relationship between the program reference voltages is best illustrated by the state diagram of FIG. 8 which is explained more fully hereinbelow. If the desired program state is the second program state, then the programming and verification operations are terminated by the program inhibition circuit (when BITS 1 and 2 of FIGS. 2 and 4 are set to "11"). However, if further programming to a third program state is desired, the operations performed by Blocks 318–324 and 326 proceed as described above with respect to Blocks 302–309. During these operations, a third reference voltage ($V_{pref3}>V_{pref2}$) is applied to the control gate of the memory cell to determine whether the third program state has been achieved. Once the third program state has been achieved, BITS 1 and 2 of FIGS. 2 and 4 are set to "11" and the programming operations are terminated for a multistate device having one reference state and three program states, Block 325. As will be understood by those skilled in the art, the above described operations for a four (4) state memory cell can be applied to an N-state memory cell (where N>4). Accordingly, the present invention is not limited to an EEPROM cell having only four (4) possible states ("00", "01", "10" and "11").

Figures 5, 6:
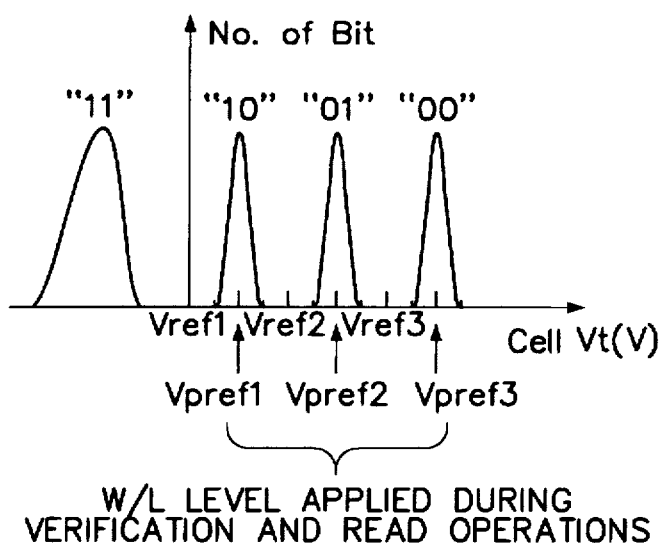
FIG. 5 is a table illustrating values of signals applied to the circuit of FIG. 2 during programming, verification and reading modes of operation.
FIG. 6 is a graphical illustration of magnitudes of word line reference voltages relative to program states, applied to the circuit of FIG. 2 during verification and reading operations.

Referring now to FIG. 4, the program, verify and read control circuit 100 of FIG. 2 and the operations for programming a memory cell 419 to a third program state ("00") will be more fully described with reference to a more detailed control circuit 400. As illustrated, a memory cell 419 is responsive to application of a control gate voltage ($V_{cg}$) which can be a program voltage ($V_{pgm}$) or one of the six reference voltages $V_{ref1}$, $V_{ref3}$ and $V_{pref1}-V_{pref3}$ which are used during verify and read operations as illustrated by the table of FIG. 5. An NMOS transistor 418 is also provided for coupling the memory cell 419 (or an end of a NAND string of memory cells) to a sense amplifier and current source 401 (via line 417) during read and verify operations. The NMOS transistor 418 is responsive to a SELECT signal.

In particular, to program the memory cell 419 into the third program state, the outputs SAO1 and SAO2 of the latches formed by inverters 404–405 and 411–412 are initially loaded with third program state data (e.g., "00") from a bit line (not shown). A program voltage pulse ($V_{pgm}$) of predetermined duration is then applied to the control gate of the memory cell 419 to program the memory cell from an erased or reference state "11" to a first program state "10". A verify operation is then performed by sensing the state of the memory cell 419 upon application of a first program verify reference voltage $V_{pref1}$. If the memory cell 419 has been programmed into the first program state, line 417 will remain "high" (i.e., logic 1) during the sense operation and NMOS transistors 406 and 415 will turn-on. As illustrated by the table of FIG. 5, a clock signal is then applied to the VFY1 signal line to turn-on NMOS transistor 414, however, because SAO2 is latched at a logic 0 value, NMOS transistor 413 will remain off and prevent the discharging of node 403 from a logic 1 value to a logic 0 value, through NMOS transistor 406. Thus, BITS 1 and 2 will remain at the "00" state.

Another program voltage pulse ($V_{pgm}$) of predetermined duration is then applied to the control gate of the memory cell 419 to program the memory cell from the first program state "10" to a second program state "01". A verify operation is then performed by sensing the state of the memory cell 419 upon application of a second program verify reference voltage ($V_{pref2}$). If the memory cell 419 has been programmed into the second program state, line 417 will remain "high" (i.e., logic 1) during the sense operation and NMOS transistors 406 and 415 will turn-on. As illustrated by the table of FIG. 5, a clock signal is then applied to the VFY2 signal line to turn-on NMOS transistor 416 and force SAO2 (BIT 2) to a logic 1 state which turns on NMOS transistor 413. Thus, at the end of the second program and verify operations, BITS 1 and 2 will switch to the "10" state.

A final program voltage pulse ($V_{pgm}$) of predetermined duration is then applied to the control gate of the memory cell 419 to program the memory cell from the second program state "10" to a third program state "00". A verify operation is then performed by sensing the state of the memory cell 419 upon application of a second program verify reference voltage ($V_{pref3}$). If the memory cell 419 has been programmed into the third program state, line 417 will remain "high" (i.e., logic 1) during the sense operation and NMOS transistors 406 and 415 will turn-on. As illustrated by the table of FIG. 5, a clock signal is then applied to the VFY1 signal line to turn-on NMOS transistor 414 and force SAO1 to a logic 1 potential by pulling node 403 to a logic 0 potential through NMOS transistor 413 (which is already on because SAO2 is at a logic 1 potential). Thus, at the end of the third program and verify operations, BITS 1 and 2 will be in the "11" state. As described above, this "11" state enables the program inhibit circuit 106 of FIG. 2 and stops further programming operations.

Figure 7:
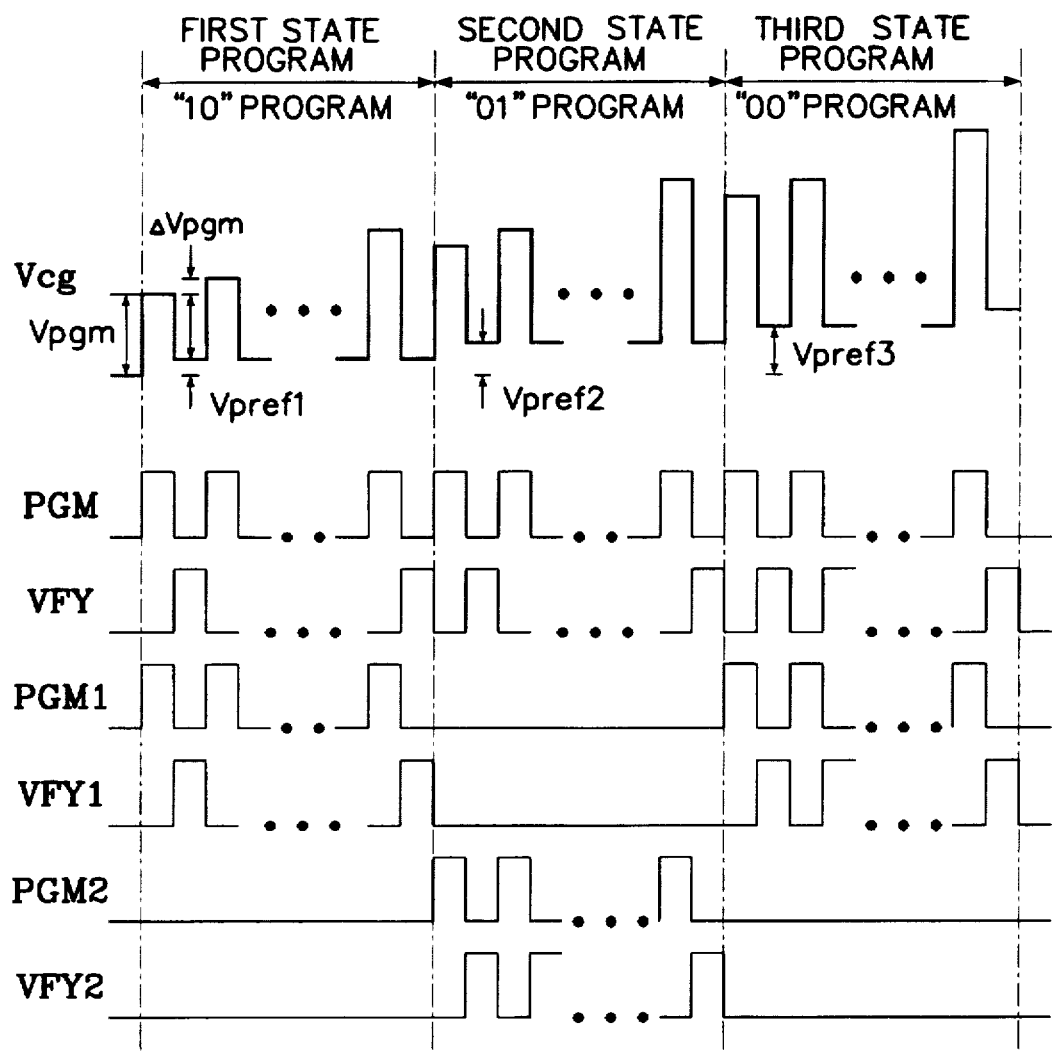
FIG. 7 is a timing diagram illustrating values of signals applied to the circuit of FIG. 2 during programming operations.

The state of the memory cell may then be read by applying the signals set forth in the table of FIG. 5. As illustrated by FIG. 6, a page of memory cells may also be simultaneously programmed to respective states by applying the program and reference signals to a common word line W/L. In particular, FIG. 6 graphically illustrates a relationship between the possible states and $V_{th}$, of a 4-state memory cell and the values of the reference voltages applied during the verification and read operations, as set forth in row "$V_{cg}$" in the table of FIG. 5. FIG. 7 is also a timing diagram illustrating operation states of clocks which are applied to operate the circuits of FIGS. 2 and 4 during the performance of program and verification operations.

Figure 8:
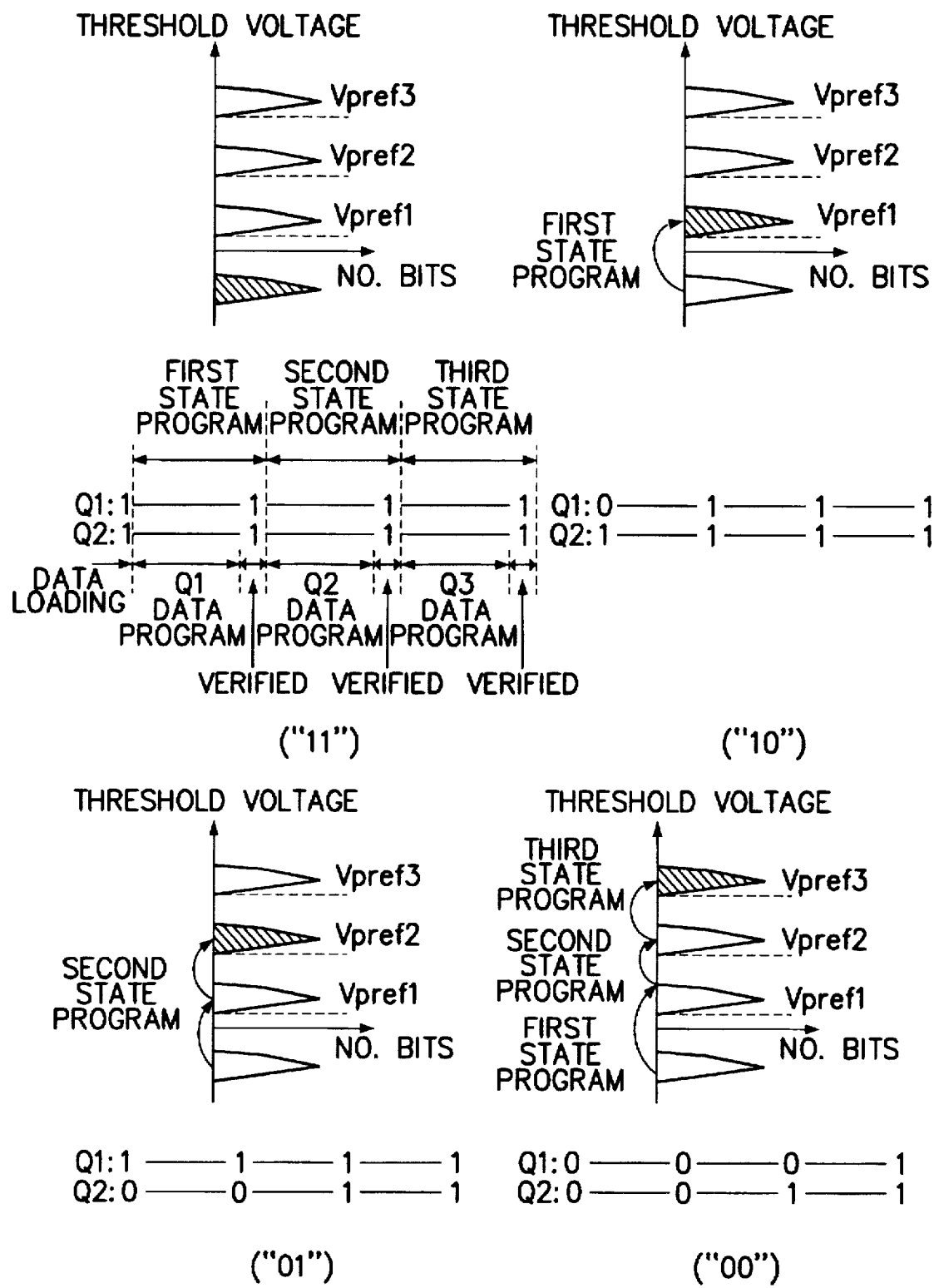
FIG. 8 is a state diagram illustrating the sequence of states of data in a two-bit latch, during programming and verification of the circuit of FIG. 2.

A state diagram illustrating the sequence of states of data in a two-bit latch, during programming and verification of the circuit of FIG. 2, is also provided by FIG. 8. In particular, in the event the outputs SAO1 and SAO2 of the latch of FIG. 4 are set to "11" when data from a page buffer is downloaded to the bit lines, no program or verify operations will be performed. However, if the outputs SAO1 and SAO2 are set to the first program state "10," a single program and verify operation will be performed for the particular cell and the respective outputs SAO1 and SAO2 for that cell will switch from 10→11→11→11, while other cells connected to the common word line W/L are programmed. In addition, if the outputs SAO1 and SAO2 are set to the second program state "00," two complete program and verify operations will be performed to switch the outputs SAO1 and SAO2 from 01→01→11→11. Similarly, if the outputs SAO1 and SAO2 are set to the third program state "00," three complete program and verify operations will be performed to switch the outputs SAO1 and SAO2 from 00→00→10→11. Accordingly, a page of memory cells can be programmed in the same amount of time it takes to program one memory cell to a third program state.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of programming an integrated circuit memory device containing a plurality of nonvolatile multi-state memory cells therein, comprising the steps of:

loading first data indicative of a desired program state into a latch;

programming a nonvolatile multi-state memory cell from a reference state towards a first program state which is unequal to the reference state by applying a first program voltage to the memory cell; then sensing a first actual state of the memory cell upon application of a first reference voltage to the memory cell and changing the first data in the latch to second data if the first actual state equals the first program state; then programming the memory cell from the first program state towards a second program state which is unequal to the first program state by applying a second program voltage to the memory cell which is unequal to the first program voltage; and then sensing a second actual state of the memory cell upon application of a second reference voltage to the memory cell which is unequal to the first reference voltage and changing the second data in the latch to third data which is indicative of the reference state if the second actual state and the second program state equal the desired program state.

2. The method of claim 1, wherein said step of programming the memory cell from the first program state towards the second program state is preceded by the step of reprogramming the memory cell from the reference state to the first program state if the first actual state is not equal to the first program state.

3. A method of programming a plurality of nonvolatile multi-state memory cells, comprising the steps of:

loading data indicative of a first program state into a first latch;

loading data indicative of a second program state that is unequal to the first program state, into a second latch;

simultaneously programming first and second memory cells from a reference state to the first program state by applying a first program voltage to a word line coupled to the first and second memory cells;

changing the data in the first latch from data indicative of the first program state to data indicative of the reference state;

selectively programming the second memory cell but not the first memory cell from the first program state to the second program state by applying a second program voltage to the word line which is unequal to the first program voltage; and changing the data in the second latch from data indicative of the second program state to data indicative of the reference state.

4. The method of claim 3, wherein said step of changing the data in the first latch is preceded by the step of verifying that the first and second memory cells are in the first program state by applying a first reference voltage which is unequal to the first program voltage, to the word line.

5. The method of claim 4, wherein said step of changing the data in the second latch is preceded by the step of verifying that the second memory cell is in the second program state by applying a second reference voltage which is unequal to the second program voltage, to the word line.

6. The method of claim 5, wherein the second program voltage is greater than the first program voltage.

7. The method of claim 5, wherein the first and second latches comprise first and second two-bit latches; wherein said step of loading data indicative of a first program state comprises loading "10" into the first latch; and wherein said step of loading data indicative of a second program state comprises loading "01" into the second latch.

8. The method of claim 7, wherein said step of changing the data in the first latch comprises loading "11" into the first latch.

9. The method of claim 8, wherein said step of changing the data in the second latch comprises loading "11" into the second latch.

10. The method of claim 8, wherein said step of changing the data in the second latch follows said step of selectively programming the second memory cell.

11. The method of claim 10, wherein said step of changing the data in the second latch comprises changing the data in the second latch from "01" to "11".

12. A method of programming a plurality of nonvolatile multi-state memory cells, comprising the steps of:

loading data indicative of a first program state into a first latch;

loading data indicative of a second program state into a second latch;

loading data indicative of a third program state into a third latch;

simultaneously programming first, second and third memory cells from a reference state to the first program state by applying a first program voltage to a word line coupled to the first, second and third memory cells;

changing the data in the first latch from data indicative of the first program state to data indicative of the reference state;

selectively programming the second and third memory cells, but not the first memory cell, from the first program state to the second program state by applying a second program voltage to the word line which is unequal to the first program voltage;

changing the data in the second latch to data indicative of the reference state;

selectively programming the third memory cell, but not the first or second memory cells, from the second program state to the third program state by applying a third program voltage to the word line which is unequal to the second program voltage; and changing the data in the third latch to data indicative of the reference state.

13. The method of claim 12, wherein said step of changing the data in the first latch is preceded by the step of verifying that the first, second and third memory cells are in the first program state by applying a first reference voltage which is unequal to the first program voltage, to the word line.

14. The method of claim 13, wherein said step of changing the data in the second latch is preceded by the step of verifying that the second and third memory cells are in the second program state by applying a second reference voltage which is unequal to the second program voltage, to the word line.

15. The method of claim 14, wherein the first, second and third latches comprise first, second and third two-bit latches; wherein said step of loading data indicative of a first program state comprises loading "10" into the first latch; wherein said step of loading data indicative of a second program state comprises loading "01" into the second latch; and wherein said step of loading data indicative of a third program state comprises loading "00" into the third latch.

16. The method of claim 15, wherein said step of changing the data in the first latch comprises loading "11" into the first latch.

17. The method of claim 16, wherein said step of changing the data in the second latch comprises changing the data in the second latch from "01" to "11"; and wherein said step of changing the data in the third latch comprises changing the data in the third latch from "00" to "11".

* * * * *